(12) United States Patent
Shimizu et al.

(10) Patent No.: US 12,377,555 B2
(45) Date of Patent: Aug. 5, 2025

(54) INCLINATION ADJUSTING DEVICE AND ROBOT PROVIDED WITH THE SAME

(71) Applicant: Kawasaki Jukogyo Kabushiki Kaisha, Kobe (JP)

(72) Inventors: Ippei Shimizu, Kobe (JP); Yoshiki Maeda, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 623 days.

(21) Appl. No.: 17/761,206

(22) PCT Filed: Sep. 14, 2020

(86) PCT No.: PCT/JP2020/034732
§ 371 (c)(1),
(2) Date: Mar. 17, 2022

(87) PCT Pub. No.: WO2021/054288
PCT Pub. Date: Mar. 25, 2021

(65) Prior Publication Data
US 2022/0339795 A1 Oct. 27, 2022

(30) Foreign Application Priority Data
Sep. 19, 2019 (JP) .................................. 2019-170365

(51) Int. Cl.
*B25J 15/00* (2006.01)
*B25J 9/10* (2006.01)
*B25J 11/00* (2006.01)

(52) U.S. Cl.
CPC ......... *B25J 15/0014* (2013.01); *B25J 9/1005* (2013.01); *B25J 11/0095* (2013.01)

(58) Field of Classification Search
CPC .. B25J 15/0014; B25J 9/1005; B25J 11/0095; B25J 9/1664; B25J 15/08
See application file for complete search history.

(56) References Cited

U.S. PATENT DOCUMENTS 4,060,314 A * 11/1977 Heinz .................. G02B 7/1821
359/876
6,401,554 B1 * 6/2002 Mori ................. H01L 21/67288
73/1.81
(Continued)

FOREIGN PATENT DOCUMENTS

DE 20 2015 106 385 U1 11/2015
JP 62-145191 U 9/1987
(Continued)

OTHER PUBLICATIONS

LiShuting, Mechanical Design Engineering Class Materials 10th Other Gear Devices (helical gears, bevel gears and worm gears, etc.), National Diet Library Internet Material Collection and Preservation Project, [online], Aug. 10, 2016, 33 pages.

*Primary Examiner* — Zakaria Elahmadi
(74) *Attorney, Agent, or Firm* — XSENSUS LLP

(57) ABSTRACT

At least three spherical surface sliding bearings provided between a first member and a second member and disposed at mutually different positions when seen in the height direction, are provided. Each of the at least three spherical surface sliding bearings has an inner ring and an outer ring, either one of the inner ring and the outer ring is attached to the first member, and the other is attached to the second member. In at least two of the at least three spherical surface sliding bearings, the height adjustment mechanism intervenes, at least either one of between one of the inner ring and the outer ring, and the first member, and between the other and the second member.

5 Claims, 7 Drawing Sheets

(56) References Cited

U.S. PATENT DOCUMENTS

| | | | |
|---|---|---|---|
| 6,931,739 B2* | 8/2005 | Chang | G01C 15/004 |
| | | | 33/286 |
| 11,964,379 B2* | 4/2024 | Wilkas | B25J 9/0087 |
| 2007/0275486 A1 | 11/2007 | Hiroki | |
| 2008/0124206 A1* | 5/2008 | Choi | H01L 21/67781 |
| | | | 700/121 |
| 2008/0203367 A1 | 8/2008 | Ashizawa | |

FOREIGN PATENT DOCUMENTS

| | | | | |
|---|---|---|---|---|
| JP | 10-64786 A | | 3/1998 | |
| JP | 10064786 A | * | 3/1998 | ......... G03F 7/70691 |
| JP | 2005-286211 A | | 10/2005 | |
| JP | 2006-120861 A | | 5/2006 | |
| JP | 2007-061920 A | | 3/2007 | |
| JP | 2007-333884 A | | 12/2007 | |
| JP | 2008-141158 A | | 6/2008 | |
| JP | 2008-174314 A | | 7/2008 | |
| JP | 2010-234498 A | | 10/2010 | |
| JP | 2013-246040 A | | 12/2013 | |
| JP | 2014-029178 A | | 2/2014 | |
| JP | 2016-067649 A | | 5/2016 | |
| JP | 2016-120755 A | | 7/2016 | |
| JP | 2018032797 A | * | 3/2018 | .............. B25J 11/00 |
| JP | 2018-199379 A | | 12/2018 | |
| JP | 2019-150912 A | | 9/2019 | |

* cited by examiner

INCLINATION ADJUSTING DEVICE AND ROBOT PROVIDED WITH THE SAME

CROSS-REFERENCE TO RELATED APPLICATIONS

The present application is based on PCT filing PCT/JP2020/034732, filed Sep. 14, 2020, which claims priority to JP 2019-170365, filed Sep. 19, 2019, the entire contents of each are incorporated herein by reference.

TECHNICAL FIELD

The present disclosure relates to an inclination adjusting device and a robot provided with the same.

BACKGROUND ART

Conventionally, semiconductor manufacturing devices are known. Such semiconductor manufacturing devices are proposed in Patent Document 1, for example.

The semiconductor manufacturing device of Patent Document 1 is provided with a wafer transferring device. The wafer transferring device is disposed adjacent to a cassette where a plurality of wafers are accommodated and to an inspection device for inspecting the wafers. The wafer transferring device includes a plurality of Y-shaped or U-shaped wafer support members, first and second support tables which are connected to a base end of each wafer support member and support the wafer support members, and a moving device which is coupled to the first and second support tables and moves the wafer support members in a linear direction.

REFERENCE DOCUMENT OF CONVENTIONAL ART

Patent Document

[Patent Document 1] JP2008-141158A

DESCRIPTION OF THE DISCLOSURE

Problem to be Solved by the Disclosure

However, according to Patent Document 1 and other conventional semiconductor manufacturing devices, with respect to a first member which constitutes a part thereof, a second member which constitutes the other part may incline.

Thus, one purpose of the present disclosure is to provide an inclination adjusting device and a robot provided with the same, capable of certainly adjusting an inclination of a second member to a first member, the first member constituting a part of a semiconductor manufacturing device and the second member constituting the other part of the semiconductor manufacturing device.

SUMMARY OF THE DISCLOSURE

In order to solve the problem, an inclination adjusting device according to the present disclosure adjusts an inclination of a second member to a first member, the first member constituting a part of a semiconductor manufacturing device and the second member constituting the other part of the semiconductor manufacturing device. The inclination adjusting device includes the first member, the second member provided opposing to the first member, and at least three spherical surface sliding bearings provided between the first member and the second member and disposed at mutually different positions when seen in a height direction. Each of the at least three spherical surface sliding bearings has an inner ring and an outer ring, either one of the inner ring and the outer ring is attached to the first member, and the other is attached to the second member. In at least two of the at least three spherical surface sliding bearings, a height adjustment mechanism intervenes, at least either one of between one of the inner ring and the outer ring, and the first member, and between the other and the second member.

According to this configuration, the at least two of the at least three spherical surface sliding bearings are each adjusted in its height position by the height adjustment mechanism. Thus, the first member and the second member can be adjusted in their inclinations with each other, without distorting. As a result, it becomes possible to certainly adjust the inclination of the second member constituting the other part of the semiconductor manufacturing device, with respect to the first member constituting a part of the semiconductor manufacturing device.

Effect of the Disclosure

According to the present disclosure, an inclination adjusting device and a robot provided with the same, capable of certainly adjusting an inclination, with respect to a first member which constitutes a part of a semiconductor manufacturing device, of a second member which constitutes the other part of the semiconductor manufacturing device.

BRIEF DESCRIPTION OF DRAWINGS

FIG. 7(A) is a cross-sectional view illustrating a state before an inclination of the robot is adjusted, and FIG. 7(B) is a cross-sectional view illustrating a state after the inclination of the robot is adjusted by the height adjustment mechanism.

is schematic view illustrating a first modification, and FIG. 8(B) is a schematic view illustrating a second modification.

MODES FOR CARRYING OUT THE DISCLOSURE

Figure 1:
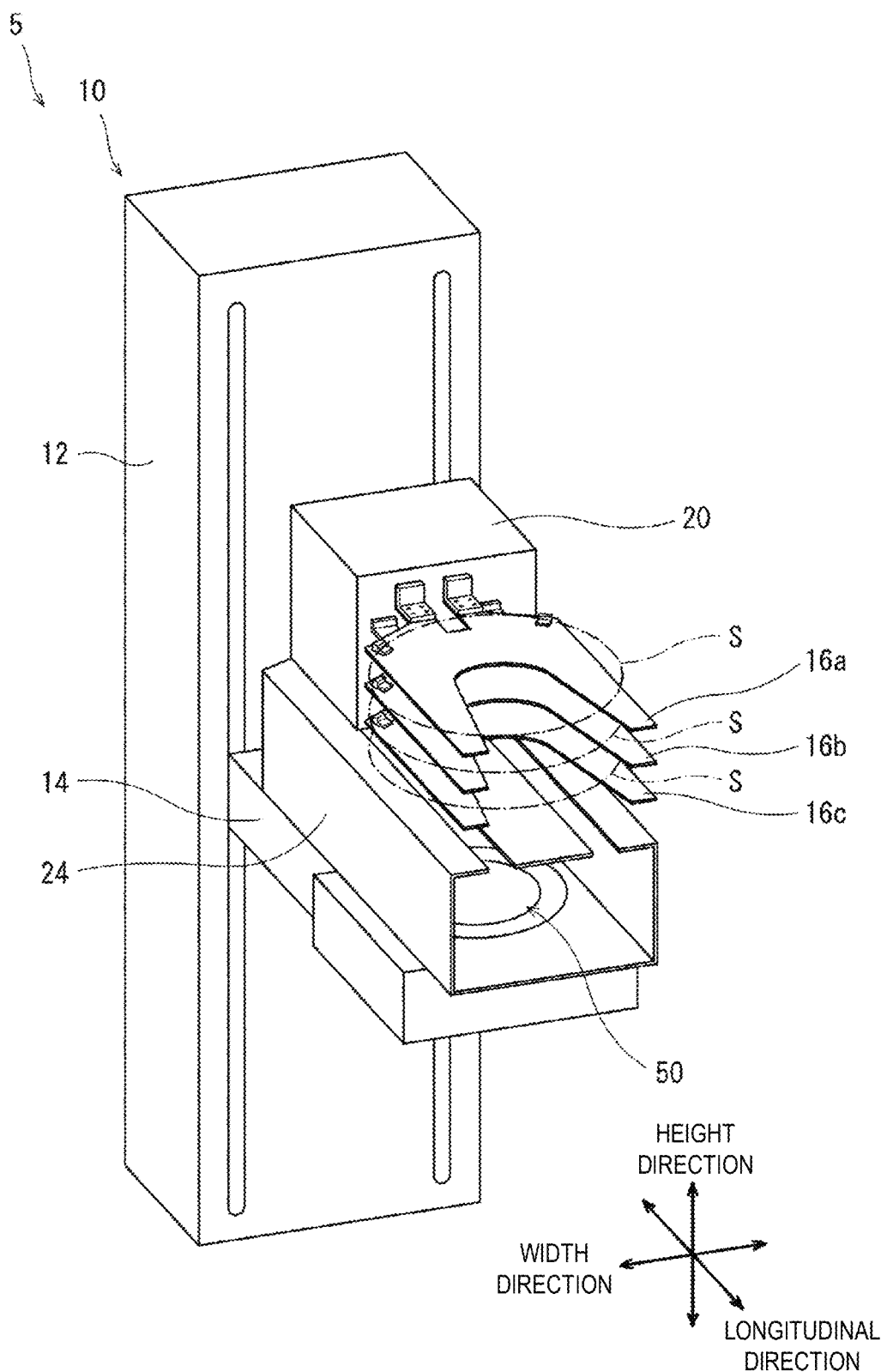
FIG. 1 is a perspective view illustrating the entire configuration of a robot according to one embodiment of the present disclosure.

Hereinafter, an inclination adjusting device according to one embodiment of the present disclosure and a robot provided with the same are described based on the accompanying drawings. Note that the present disclosure is not limited by the embodiment. Further, below, throughout the drawings, the same reference characters are assigned to the same or corresponding elements to omit redundant description.

(Robot 10)

FIG. 1 is a perspective view illustrating the entire configuration of a robot according to this embodiment. As illustrated in FIG. 1, the robot 10 according to this embodiment is configured as a part of a semiconductor manufacturing device 5, which is used for transferring a semiconductor substrate S illustrated by one-dot chain line in FIG. 1, while holding the semiconductor substrate S. The robot 10 includes a plate-like base body 12 extending in a height direction, and a wrist part 14 of which a base end is attached to the base body 12 and is movable on the base body 12 in the height direction by being driven by a first drive (not illustrated).

The robot 10 further includes three blades 16a-16c where a holding position for holding the semiconductor substrate S is defined, and a hold member 20 which holds base ends of the three blades 16a-16c.

The robot 10 further includes a rotation shaft 22 (see FIG. 2) extending in the height direction and of which a base end is attached to an inclination adjusting device 50 (described later), and a support member 24 of which a base end is attached to the inclination adjusting device 50 via the rotation shaft 22, which is rotatable around the rotation shaft 22, and which supports the hold member 20. The hold member 20 is linearly movable on the support member 24 in the longitudinal direction illustrated in FIG. 1 by being driven by a second drive (not illustrated).

(Inclination Adjusting Device 50)

Figure 2:
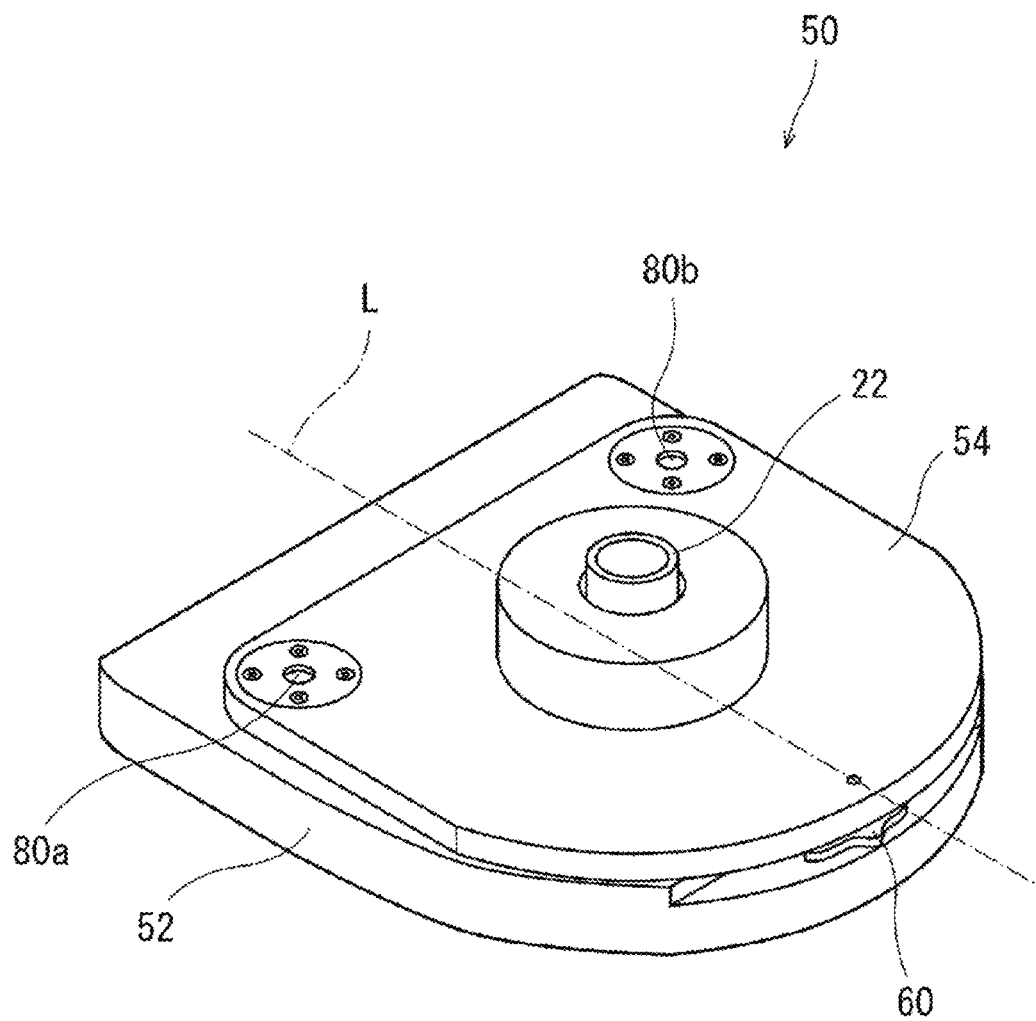
FIG. 2 is a perspective view illustrating an inclination adjusting device according to one embodiment of the present disclosure.
Figure 2:
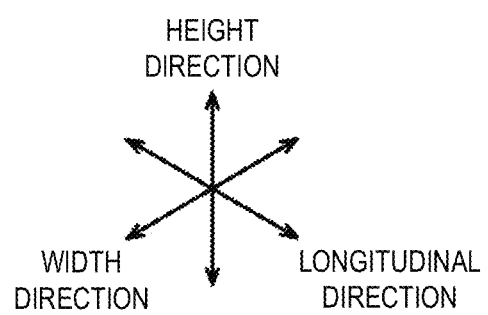

FIG. 2 is a perspective view illustrating the inclination adjusting device according to this embodiment. The robot 10 according to this embodiment further includes the inclination adjusting device 50. The inclination adjusting device 50 is provided at a tip end of the wrist part 14.

The inclination adjusting device 50 includes a plate-like first member 52 provided on the wrist part 14 side, and a plate-like second member 54 provided on the hold member 20 side so as to oppose to the first member 52. Note that the first member 52 is also a member which constitutes a part of the semiconductor manufacturing device 5, and the second member 54 is also a member which constitutes the other part of the semiconductor manufacturing device 5. The inclination adjusting device 50 is provided in order to adjust an inclination, with respect to the first member 52 which constitutes a part of the semiconductor manufacturing device 5, of the second member 54 which constitutes the other part of the semiconductor manufacturing device 5.

The inclination adjusting device 50 further includes three spherical surface sliding bearings 60, 80a, and 80b which are provided between the first member 52 and the second member 54 and are disposed at mutually different positions when seen in the height direction.

The spherical surface sliding bearing 60 is provided at a tip end on a center line L extending at the center in the width direction of the inclination adjusting device 50 from a base end to a tip end. The spherical surface sliding bearings 80a and 80b are provided on the base-end side of the robot 10 from the spherical surface sliding bearing 60. Further, the spherical surface sliding bearings 80a and 80b are disposed to be line symmetry to each other with respect to the center line L as an axis of symmetry, when seen in the height direction. Note that the spherical surface sliding bearings 80a and 80b are disposed at the same height which is higher than the spherical surface sliding bearing 60.

Figure 3:
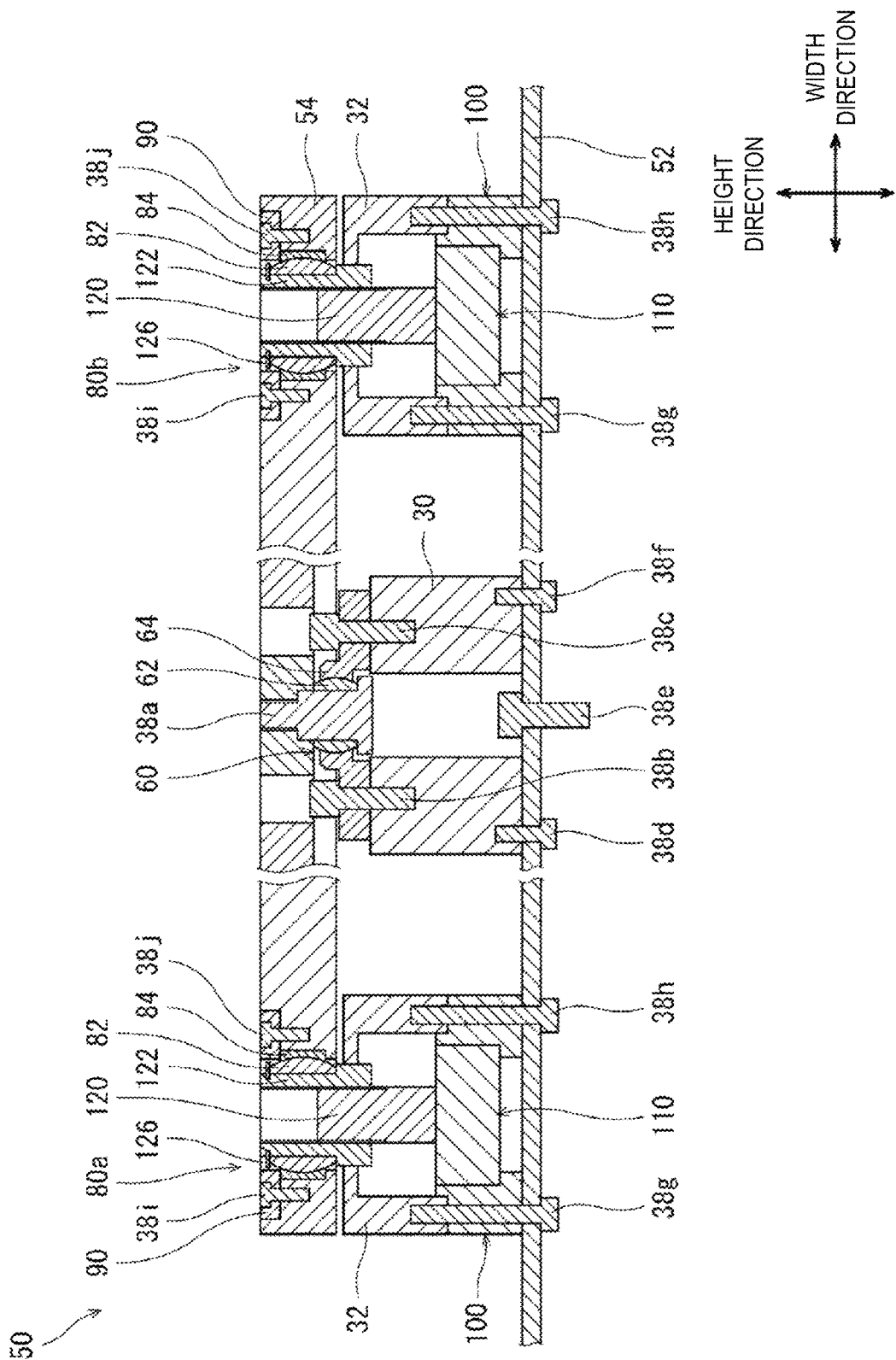
FIG. 3 is a cross-sectional view of the inclination adjusting device according to one embodiment of the present disclosure, in the height direction.

FIG. 3 is a cross-sectional view of the inclination adjusting device according to this embodiment, in the height direction. As illustrated in FIG. 3, the spherical surface sliding bearing 60 has an inner ring 62 and an outer ring 64. As for the spherical surface sliding bearing 60, the outer ring 64 is attached to the first member 52 via a first intermediate member 30, and the inner ring 62 is attached to the second member 54 with a bolt 38a. The outer ring 64 is attached to the first intermediate member 30 with bolts 38b and 38c etc., and the first intermediate member 30 is attached to the first member 52 with bolts 38d-38f etc. Note that, between the outer ring 64 and the first member 52, a height adjustment mechanism 100 (described later) does not intervene.

As illustrated in FIG. 3, the spherical surface sliding bearing 80a has an inner ring 82 and an outer ring 84. As for the spherical surface sliding bearing 80a, the inner ring 82 is attached to the first member 52, and the outer ring 84 is attached to the second member 54. Between the inner ring 82 and the first member 52, a second intermediate member 32 and the height adjustment mechanism 100 intervene. The first member 52, the height adjustment mechanism 100, and the second intermediate member 32 are mutually fixed with bolts 38g and 38h etc. which penetrate the first member 52 and the height adjustment mechanism 100 and reach the second intermediate member 32.

Note that the spherical surface sliding bearing 80b has the same structure as the spherical surface sliding bearing 80a, and similarly to the spherical surface sliding bearing 80a, the inner ring 82 is attached to the first member 52 and the outer ring 84 is attached to the second member 54. Therefore, here, similar description of the spherical surface sliding bearing 80b will not be repeated.

Figure 4:
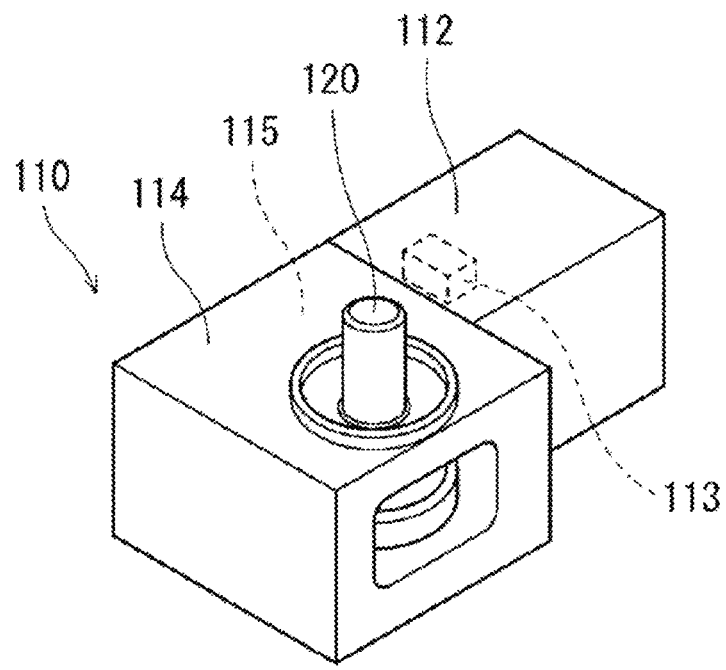
FIG. 4 is a perspective view illustrating a part of a height adjustment mechanism of the inclination adjusting device according to one embodiment of the present disclosure.

FIG. 4 is a perspective view illustrating a part of the height adjustment mechanism of the inclination adjusting device according to this embodiment. As illustrated in FIGS. 3 and 4, the height adjustment mechanism 100 has a motor unit 110, a male threaded member 120 which is rotated by a motor 112 of the motor unit 110, and a female threaded member 122 (moving member) which moves in the height direction by the rotation of the male threaded member 120. In other words, the female threaded member 122 is movable in the height direction by being rotated by the motor 112.

Figure 5:
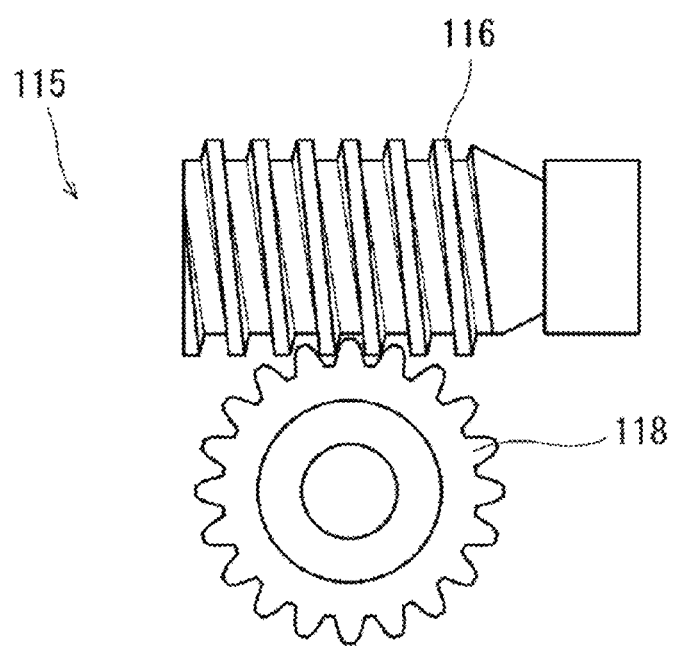
FIG. 5 is a schematic view illustrating a worm-gear mechanism (worm drive) of the inclination adjusting device according to one embodiment of the present disclosure.

FIG. 5 is a schematic view illustrating a worm-gear mechanism of the inclination adjusting device according to one embodiment of the present disclosure. As illustrated in FIGS. 4 and 5, the motor unit 110 (as a result, the height adjustment mechanism 100) includes the motor 112, an encoder 113 illustrated by broken lines in FIG. 4 for detecting a rotational position of the motor 112, a casing 114 fixed to the motor 112, and a worm-gear mechanism 115 (speed-reduction mechanism) which is disposed inside the casing 114, and reduces the power of the motor 112 and outputs it to the male threaded member 120 and the female threaded member 122.

As illustrated in FIG. 5, the worm-gear mechanism 115 includes a bar-like worm 116 which is rotated by the motor 112, and a gear-like worm wheel 118 which meshes with the worm 116. As for a thread groove formed in the external surface of the worm 116 is formed so that its lead angle is comparatively small.

The motor unit 110 further has the male threaded member 120 which is fixed at the center of the worm wheel 118 of the worm-gear mechanism 115 and extends in the height direction. The male threaded member 120 rotates integrally with the worm wheel 118. As for a thread groove formed in the external surface of the male threaded member 120 is formed so that its lead angle is comparatively small. Note that the female threaded member 122 is configured so that it threadedly engages with the male threaded member 120 and moves in the height direction by the rotation of the male threaded member 120.

Figure 6:
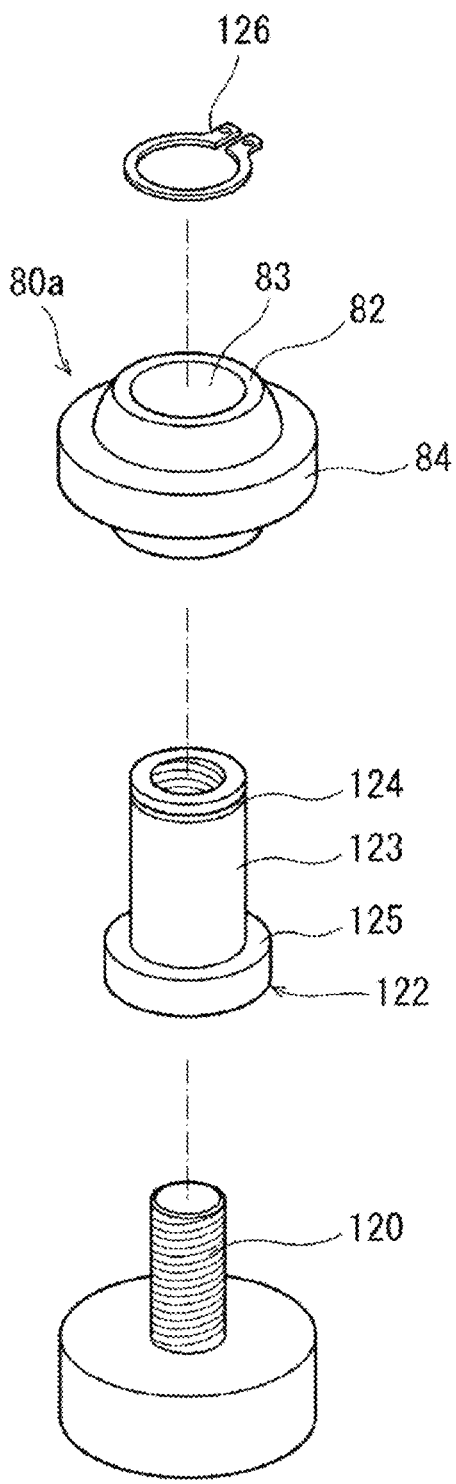
FIG. 6 is an exploded perspective view illustrating a spherical surface sliding bearing, a male threaded member, and a female threaded member, of the inclination adjusting device according to one embodiment of the present disclosure.

FIG. 6 is an exploded perspective view illustrating the spherical surface sliding bearing, the male threaded member, and the female threaded member, of the inclination adjusting device according to this embodiment. As illustrated in FIG. 6, the female threaded member 122 has a cylindrical shank 123 where a thread groove is formed in its inner wall, and a flange 125 provided at a base end of the shank 123. An annular groove 124 is formed in a tip-end part of the shank 123.

The shank 123 of the female threaded member 122 is inserted into a shaft hole 83 of the inner ring 82 of the spherical surface sliding bearing 80a. When a lower end of the inner ring 82 of the spherical surface sliding bearing 80a is brought in contact with an upper surface of the flange 125, the groove 124 of the shank 123 is positioned at an upper end of the inner ring 82. In this state, by fitting an arc-shaped anchor 126 into the groove 124, the spherical surface sliding bearing 80a is fixed to the female threaded member 122. Further, the male threaded member 120 is inserted into the female threaded member 122, while threadedly engaging the male threaded member 120 from the flange 125 side with the shaft hole of the female threaded member 122.

Thus, the height adjustment mechanism 100 is attached to the spherical surface sliding bearing 80a. Note that, although a similar height adjustment mechanism 100 is attached also to the spherical surface sliding bearing 80b, description thereof will not be repeated herein.

Figure 7:
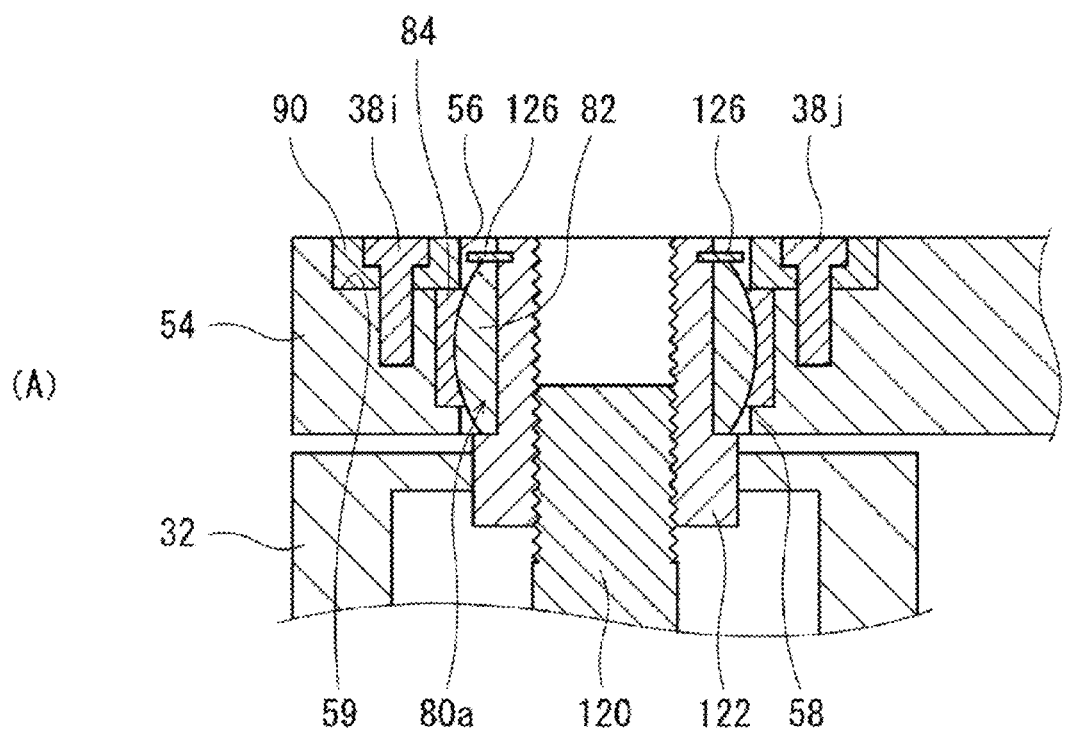
FIGS. 7(A) and 7(B) are cross-sectional views of the spherical surface sliding bearing of the inclination adjusting device according to one embodiment of the present disclosure and its periphery, in the height direction, where
Figure 7:
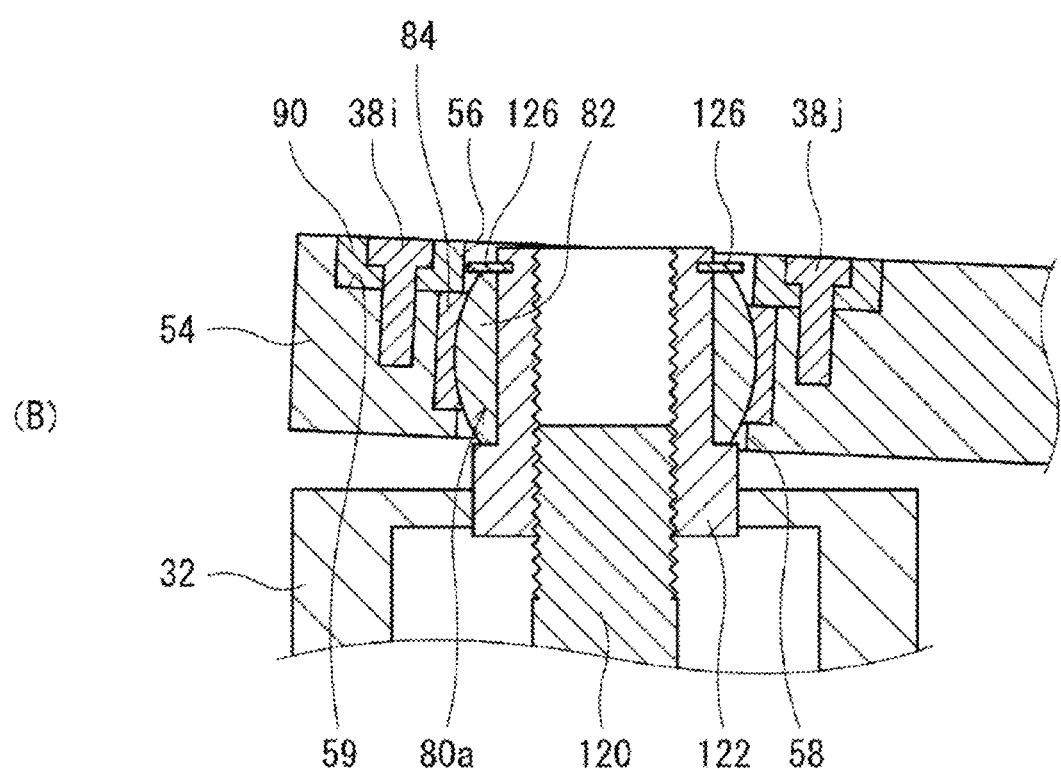

FIGS. 7(A) and 7(B) are cross-sectional views of the spherical surface sliding bearing of the inclination adjusting device according to this embodiment and its periphery, in the height direction, where FIG. 7(A) is a cross-sectional view illustrating a state before the inclination of the robot is adjusted, and FIG. 7(B) is a cross-sectional view illustrating a state after the inclination of the robot is adjusted by the height adjustment mechanism.

As illustrated in FIGS. 7(A) and 7(B), the spherical surface sliding bearing 80a to which the height adjustment mechanism 100 is attached is inserted into a through-hole 56 formed in the second member 54, and is placed so that an outer edge part of a lower surface of the outer ring 84 is placed on a projection 58 which projects from a lower end of an inner wall of the through-hole 56.

Further, an outer edge part of an upper surface of the outer ring 84 contacts a center part of a lower surface of a lid member 90 (in detail, a periphery part of the shaft hole of the lower surface of the lid member 90). The lid member 90 is fitted into a recess 59 formed in the second member 54. The through-hole 56 is formed in the center part of the recess 59 in the height direction.

Further, the lid member 90 is fixed to the recess 59 with bolts 38i and 38j etc. in a state where it is fitted into the recess 59 of the second member 54. Thus, by fixing the lid member 90 to the recess 59 of the second member 54, the spherical surface sliding bearing 80a is positioned inside the through-hole 56 formed in the second member 54.

(Mode for Adjusting Inclination of Robot 10)

Next, mainly based on FIGS. 7(A) and 7(B), one example of a mode for adjusting the inclination of the robot 10 is described using the inclination adjusting device 50 described above. Note that, below, in FIG. 3 one side part (not illustrated in FIG. 3) of the support member 24 which opposes to a left side part of the second member 54 is lower than the other side part (not illustrated in the figure) of the support member 24 which opposes to a right side of the second member 54, and therefore, a case where an inclination of the second member 54 with respect to the first member 52 is thus adjusted by the inclination adjusting device 50 is described.

First, from the state illustrated in FIG. 7(A), the male threaded member 120 is rotated by the motor 112 via the worm-gear mechanism 115.

When the male threaded member 120 is rotated by the motor 112, the female threaded member 122 which threadedly engages with the male threaded member 120 moves in the height direction, without changing the height of the male threaded member 120 itself. In FIG. 7(B), a situation where the female threaded member 122 is fed upward by the male threaded member 120 rotating to the right is illustrated (in other words, a situation where the female threaded member 122 is moved in the height direction).

When the female threaded member 122 moves upwardly, the inner ring 82 of the spherical surface sliding bearing 80a which is fixed to the female threaded member 122 by the anchor 126 also moves upwardly, integrally therewith. At this time, since the heights of the spherical surface sliding bearings 60 and 80b do not change, the outer ring 84 of the spherical surface sliding bearing 80a inclines to a plane perpendicular to the height direction, while sliding on a contact surface of the inner ring 82.

As described above, when the outer ring 84 of the spherical surface sliding bearing 80a inclines to the plane perpendicular to the height direction, the second member 54 fixed to the outer ring 84 also inclines to the plane perpendicular to the height direction. At this time, the inner ring 62 of the spherical surface sliding bearing 60, and the bolt 38a fixed to the shaft hole of the inner ring 62 inclines to the plane perpendicular to the height direction, while the inner ring 62 slides on the contact surface of the outer ring 64. The outer ring 84 of the spherical surface sliding bearing 80b also inclines to the plane perpendicular to the height direction, while sliding on the contact surface of the inner ring 82.

Here, the first member 52 is attached to the wrist part 14, and the second member 54 is attached to the support member 24. Therefore, by the second member 54 inclines to the plane perpendicular to the height direction as described above, the inclination of the support member 24 to the wrist part 14 can be adjusted, and, as a result, the inclination of the robot 10 can be adjusted.

Note that, in the above, the inclination of the second member 54 with respect to the first member 52 is adjusted by the height adjustment mechanism 100 adjusting the height of the spherical surface sliding bearing 80a. However, the inclination of the second member 54 with respect to the first member 52 may be adjusted by the height adjustment mechanism 100 adjusting the height of the spherical surface sliding bearing 80b as needed.

Effects

Here, a case is considered where, without providing the spherical surface sliding bearings 60, 80a, and 80b to the inclination adjusting device 50, the inclination of the second member 54 with respect to the first member 52 is adjusted by two height adjustment mechanisms 100 which are disposed at mutually different positions when seen in the height direction. In such a case, when the second member 54 is inclined to the first member 52 by operating one of the two height adjustment mechanisms 100, the second member 54 will be distorted. Further, since the female threaded member 122 tends to incline integrally with the second member 54, the male threaded member 120 becomes impossible to rotate inside the female threaded member 122.

On the other hand, as for the inclination adjusting device 50 according to this embodiment, when the spherical surface sliding bearing 80a is adjusted in the height by the height adjustment mechanism 100 as described above, the outer rings 84 of the spherical surface sliding bearings 80a and 80b and the inner ring 62 of the spherical surface sliding bearing 60 incline to the plane perpendicular to the height direction. Thus, the second member 54 can be inclined with respect to the first member 52, without distorting the second member 54, and without the male threaded member 120 becoming impossible to rotate inside the female threaded member 122. As a result, the inclination adjusting device 50 according to this embodiment becomes possible to certainly adjust the inclination of the second member 54 with respect to the first member 52, where the first member 52 constitutes a part of the semiconductor manufacturing device 5, and the second member 54 constitutes the other part of the semiconductor manufacturing device 5.

Further, in this embodiment, the female threaded member 122 (moving member) is moved in the height direction by the motor 112 rotating the male threaded member 120. Thus, by moving the female threaded member 122 in the height direction using the motor 112, it becomes possible to easily and precisely adjust the inclination of the second member 54 with respect to the first member 52. Note that the inclination adjusting device 50 according to this embodiment becomes possible to adjust the inclination of the second member 54 with respect to the first member 52 much more precisely by controlling the operation of the motor 112 based on the rotational position of the motor 112 detected by the encoder 113.

Further, since in this embodiment the worm-gear mechanism 115 for reducing the power of the motor 112 and outputting it to the female threaded member 122 is provided, a large reduction ratio can be obtained with less space. Especially, since the inclination adjusting device 50 according to this embodiment is disposed in the comparatively narrow space and adjusts the comparatively minute inclination of the robot 10, providing the worm-gear mechanism 115 as described above is effective.

In this embodiment, since the lead angle of the thread groove formed in the external surface of the worm 116 is formed comparatively small, even if an external force is applied to the worm 116 in the axial direction, a component for rotating the worm 116 by the external force becomes smaller. Therefore, the inclination adjusting device 50 according to this embodiment becomes possible to attain a self-locking mechanism which does not require motor braking. Note that since the lead angle of the thread groove formed in the external surface of the male threaded member 120 is also formed comparatively small, it becomes possible to similarly attain the self-locking mechanism by this structure.

First and Second Modifications

It is apparent for the person skilled in the art that many improvements and other embodiments of the present disclosure are possible from the above description. Therefore, the above description is to be interpreted only as illustration, and it is provided in order to teach the person skilled in the art the best mode that implements the present disclosure. The details of the structures and/or the functions may be changed substantially, without departing from the spirit of the present disclosure.

Figure 8:
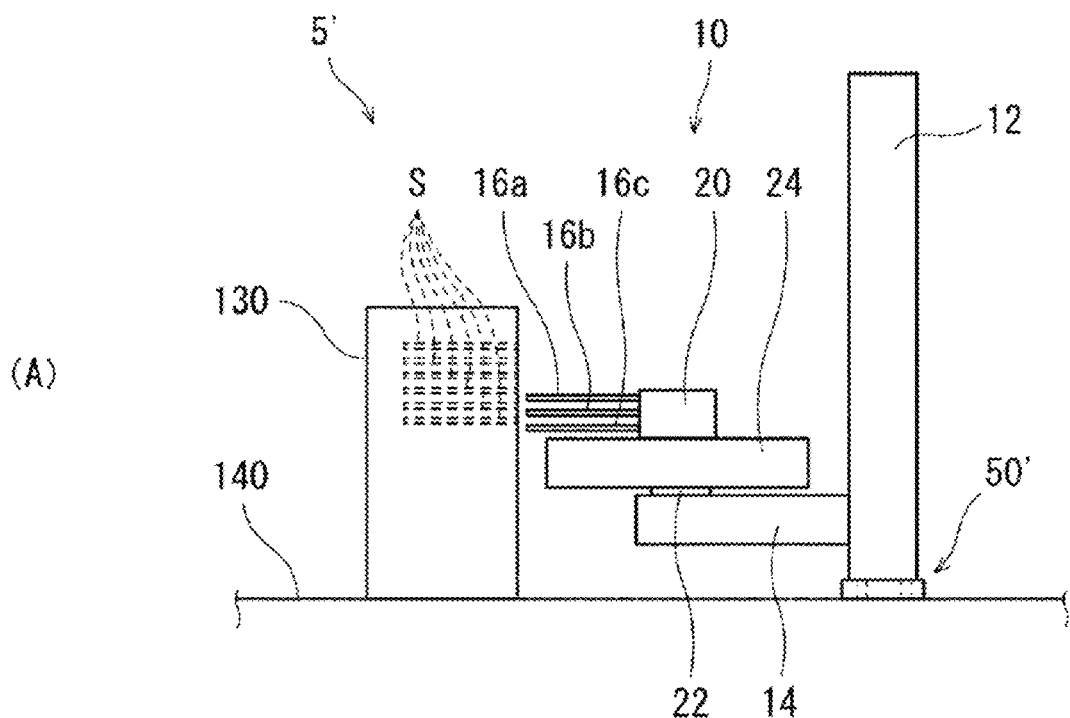
FIGS. 8(A) and 8(B) are schematic views illustrating modifications of the semiconductor manufacturing device provided with the inclination adjusting device according to one embodiment of the present disclosure, where FIG. 8(A)
Figure 8:
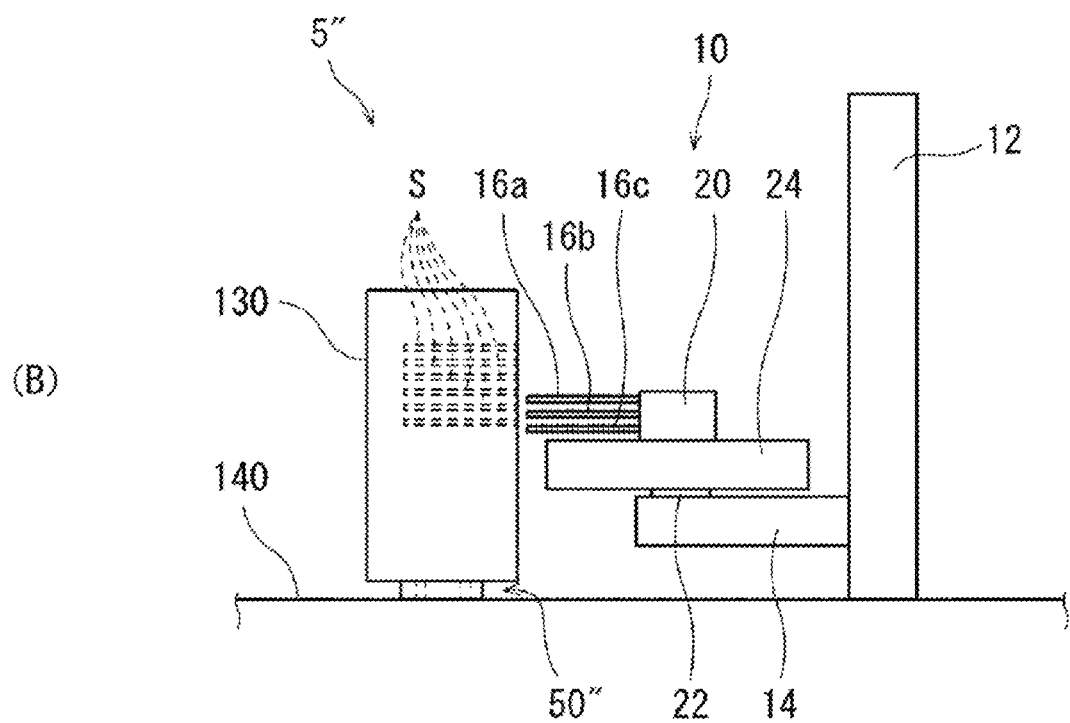

Based on FIGS. 8(A) and 8(B), a first modification and a second modification of the semiconductor manufacturing device 5 according to the above embodiment are described. FIGS. 8(A) and 8(B) are schematic views illustrating the modifications of the semiconductor manufacturing device provided with the inclination adjusting device according to this embodiment, where FIG. 8(A) is a schematic view illustrating the first modification, and FIG. 8(B) is a schematic view illustrating the second modification.

Note that a semiconductor manufacturing device 5' according to the first modification has a similar configuration to the semiconductor manufacturing device 5 according to the above embodiment, except for being provided with an accommodating device 130 which accommodates a plurality of semiconductor substrates S laminated in the height direction, and except for a part where the inclination adjusting device is provided. Further, similar things can be said for a semiconductor manufacturing device 5" according to the second modification. Therefore, below, the same reference characters are assigned to the same components not to repeat similar description.

As illustrated in FIG. 8(A), the semiconductor manufacturing device 5' according to the first modification includes the robot 10, and the accommodating device 130 which is disposed adjacent to the robot 10, and accommodates the plurality of semiconductor substrates S laminated in the height direction. The accommodating device 130 may be configured as a so-called "FOUP (Front Opening Unified Pod)" which can accommodate the plurality of semiconductor substrates S in a sealed state, for example.

The base body 12 and the accommodating device 130 of the robot 10 are placed on a placement surface 140 which constitutes a part of the semiconductor manufacturing device 5'. Note that, in this modification, the placement surface 140 is configured as a floor surface. Further, in this modification, an inclination adjusting device 50' is provided between the base body 12 and the placement surface 140. Therefore, the inclination adjusting device 50' according to this modification becomes possible to certainly adjust the inclination of the base body 12 to the placement surface 140.

As illustrated in FIG. 8(B), in the semiconductor manufacturing device 5" according to the second modification, an inclination adjusting device 50" is provided between the accommodating device 130 and the placement surface 140. Therefore, the inclination adjusting device 50" according to this modification becomes possible to certainly adjust the inclination of the accommodating device 130 to the placement surface 140.

Other Modifications

In the above embodiment, the inclination adjusting device 50 is provided between the wrist part 14 of the robot 10 and the support member 24, in the first modification, the inclination adjusting device 50' is provided between the placement surface 140 and the base body 12, and in the second modification, the inclination adjusting device 50" is provided between the placement surface 140 and the base body 12. However, without being limited to this case, the inclination adjusting device 50 may be provided anywhere between the first member which constitutes a part of the semiconductor manufacturing device 5 and the second member which constitutes the other part of the semiconductor manufacturing device 5 (for example, between the support member 24 and the hold member 20).

Note that, in the above embodiment, the plate-like first member 52 is provided separately from the wrist part 14, and the plate-like second member 54 is provided separately from the support member 24. Further, in the first modification, the first member 52 is provided separately from the placement surface 140, and the second member 54 is provided separately from the base body 12. Further, in the second modification, the first member 52 is provided separately from the placement surface 140, and the second member 54 is provided separately from the accommodating device 130.

However, without being limited to these cases, for example, a part of the wrist part 14 may be configured as the first member, and a part of the support member 24 may be configured as the second member. Similarly, a part of the placement surface 140 may be configured as the first member, and each of a part of the base body 12 and a part of the accommodating device 130 may be configured as the second member.

In the above embodiment, the three spherical surface sliding bearings 60, 80a, and 80b are provided between the first member 52 and the second member 54, and are disposed at mutually different positions when seen in the height direction. However, without being limited to the case, four or more spherical surface sliding bearings may be disposed at mutually different positions when seen in the height direction. That is, at least three or more spherical surface sliding bearings may be provided between the first member 52 and the second member 54, and may be disposed at mutually different positions when seen in the height direction.

In the above embodiment, as for the spherical surface sliding bearings 80a and 80b, the inner ring 82 is attached to the first member 52, the outer ring 84 is attached to the second member 54, and the height adjustment mechanism 100 intervenes between the inner ring 82 and the first member 52.

However, without being limited to this case, as for the spherical surface sliding bearings 80a and 80b, the outer ring 84 may be attached to the first member 52, and the inner ring 82 may be attached to the second member 54. That is, as for the spherical surface sliding bearings 80a and 80b, either one of the inner ring 82 and the outer ring 84 may be attached to the first member 52, and the other may be attached to the second member 54. Note that the inner ring 82 of the spherical surface sliding bearing 80a may be attached to the first member 52, and the inner ring 82 of the spherical surface sliding bearing 80b may be attached to the second member 54, or vice versa. Further, similar things can be said for the outer rings 84 of the spherical surface sliding bearings 80a and 80b.

Further, as for the spherical surface sliding bearings 80a and 80b, the height adjustment mechanism 100 may intervene between the outer ring 84 and the second member 54. Note that, as for the spherical surface sliding bearings 80a and 80b, the height adjustment mechanism 100 may intervene between the inner ring 82 and the first member 52, and between the outer ring 84 and the second member 54, respectively. That is, as for the spherical surface sliding bearings 80a and 80b, the height adjustment mechanism 100 may intervene at least either between the inner ring 82 and first member 52, or between the outer ring 84 and the second member 54.

In the above embodiment, as for the spherical surface sliding bearing 60, the outer ring 64 is attached to the first member 52, the inner ring 62 is attached to the second member 54, and the height adjustment mechanism 100 does not intervene between the outer ring 64 and the first member 52. However, without being limited to this case, for example, similarly to the spherical surface sliding bearings 80a and 80b, the height adjustment mechanism 100 may intervene between the outer ring 64 and the first member 52. Further, similarly to the spherical surface sliding bearings 80a and 80b, the inner ring 62 may be attached to the first member 52, and the outer ring 64 may be attached to the second member 54.

In the above embodiment, in order for the height adjustment mechanism 100 to move the female threaded member 122 in the height direction, the height adjustment mechanism 100 has the motor 112 for rotating the male threaded member 120. However, without being limited to this case, in order to move the female threaded member 122 in the height direction, the height adjustment mechanism 100 may have a user interface for manually rotating the male threaded member 120, instead of the motor 112. Instead of the male threaded member 120, the female threaded member 122, and the motor 112, the moving member may be moved in the height direction by using a mechanism, such as an air cylinder.

In the above embodiment, the worm-gear mechanism 115 intervenes between the motor 112 and the male threaded member 120. However, without being limited to the case, the motor 112 and the male threaded member 120 may be coupled directly to each other, or a speed-reduction mechanism other than the worm-gear mechanism 115 may be provided.

In the above embodiment, the three spherical surface sliding bearings 60, 80a, and 80b are disposed at mutually different positions when seen in the height direction, and the spherical surface sliding bearings 80a and 80b are disposed at the same height which is higher than the spherical surface sliding bearing 60. However, without being limited to this case, if the three spherical surface sliding bearings 60, 80a, and 80b are disposed at mutually different positions when seen in the height direction, the spherical surface sliding bearings 80a and 80b may be disposed at mutually different heights, or the three spherical surface sliding bearings 60, 80a, and 80b may be disposed at the same height.

SUMMARY

The inclination adjusting device according to the present disclosure adjusts the inclination of the second member to the first member, the first member constituting a part of the semiconductor manufacturing device and the second member constituting the other part of the semiconductor manufacturing device. The inclination adjusting device includes the first member, the second member provided opposing to the first member, and the at least three spherical surface sliding bearings provided between the first member and the second member and disposed at mutually different positions when seen in the height direction. Each of the at least three spherical surface sliding bearings has the inner ring and the outer ring, either one of the inner ring and the outer ring is attached to the first member, and the other is attached to the second member. In at least two of the at least three spherical surface sliding bearings, the height adjustment mechanism intervenes, at least either one of between one of the inner ring and the outer ring, and the first member, and between the other and the second member.

According to this configuration, the at least two of the at least three spherical surface sliding bearings are each adjusted in its height position by the height adjustment mechanism. Thus, the first member and the second member can be adjusted in their inclinations with each other, without distorting. As a result, it becomes possible to certainly adjust the inclination of the second member constituting the other part of the semiconductor manufacturing device, with respect to the first member constituting a part of the semiconductor manufacturing device.

The height adjustment mechanism may include the motor, and the moving member configured to move in the height direction by being rotated by the motor. The moving member may be fixed to either one of the inner ring and the outer ring.

According to this configuration, by moving the moving member in the height direction using the motor, it becomes possible to easily and precisely adjust the inclination of the second member with respect to the first member.

For example, the height adjustment mechanism may further include the speed-reduction mechanism configured to reduce power by the motor and output the power to the moving member.

For example, in at least two of the at least three spherical surface sliding bearings, the inner ring may be attached to the first member, the outer ring may be attached to the second member, and the height adjustment mechanism may intervene between the inner ring and the first member.

For example, in at least one of the at least three spherical surface sliding bearings, the outer ring may be attached to the first member, the inner ring may be attached to the second member, and the height adjustment mechanism may not intervene between the outer ring and the first member.

The robot according to the present disclosure is configured as a part of the semiconductor manufacturing device, and transfers the semiconductor substrate, while holding the semiconductor substrate. The robot includes the inclination adjusting device having any one of the configurations described above, the blade where the holding position at which the semiconductor substrate is held is defined, the hold member configured to hold the base end of the blade, and the wrist part provided on the base-end side from the hold member.

According to this configuration, since the robot according to the present disclosure includes the inclination adjusting device having any one of the configurations described above, it becomes possible to certainly adjust the inclination of the second member constituting the other part of the semiconductor manufacturing device, with respect to the first member constituting a part of the semiconductor manufacturing device.

For example, the support member configured to support the hold member may further be provided, and the hold member may be linearly movable on the support member. The inclination adjusting device may be provided between the wrist part and the support member so that the first member is located on the wrist part side and the second member is located on the support member side.

For example, the rotation shaft extending in the height direction and attached to the second member, may further be provided, and the support member may be rotatable around the rotation shaft.

For example, the base body extending in the height direction, may further be provided, the base end of the wrist part being attached to the base body. The wrist part may be movable on the base body in the height direction.

What is claimed is:

1. A robot configured as a part of a semiconductor manufacturing device, and configured to transfer a semiconductor substrate, while holding the semiconductor substrate, the robot comprising:
   an inclination adjusting device configured to adjust an inclination of a second structure to a first structure, the first structure constituting a part of the semiconductor manufacturing device and the second structure constituting another part of the semiconductor manufacturing device, the inclination adjusting device including:
   the first structure;
   the second structure provided opposing to the first structure; and
   a spherical surface sliding bearing provided between the first structure and the second structure, wherein
   the spherical surface sliding bearing has an inner ring and an outer ring, either one of the inner ring and the outer ring being attached to the first structure, and the other being attached to the second structure,
   in the spherical surface sliding bearing, a height adjustment structure intervenes at least either one of between one of the inner ring and the outer ring, and the first structure, and between the other and the second structure,
   the height adjustment structure includes:
     a motor;
     a male threaded structure that is rotated by the motor; and
     a female threaded structure that moves in a height direction by rotation of the male threaded structure, and
     the female threaded structure is attached to the inner ring;
   a blade where a holding position at which the semiconductor substrate is held is defined;
   a hold structure configured to hold a base end of the blade; and
   a wrist part provided on a base-end side from the hold structure.

2. The robot of claim 1, wherein the height adjustment structure further includes a speed-reduction structure configured to reduce power by the motor and output the power to the female threaded structure.

3. The robot of claim 1, further comprising a support structure configured to support the hold structure,
   wherein the hold structure is linearly movable on the support structure, and
   wherein the inclination adjusting device is provided between the wrist part and the support structure so that the first structure is located on the wrist part side and the second structure is located on a support structure side.

4. The robot of claim 3, further comprising a rotation shaft extending in a height direction and attached to the second structure,
   wherein the support structure is rotatable around the rotation shaft.

5. The robot of claim 1, further comprising a base body extending in a height direction, a base end of the wrist part being attached to the base body,
   wherein the wrist part is movable on the base body in the height direction of the base body.

* * * * *